US012761323B2

(12) United States Patent
Kornmayer et al.

(10) Patent No.: US 12,761,323 B2
(45) Date of Patent: Oct. 13, 2026

(54) OPTOELECTRONIC SENSOR FOR DETECTING OBJECTS IN A MONITORED AREA

(71) Applicant: SICK AG, Waldkirch (DE)

(72) Inventors: Jens Kornmayer, Waldkirch (DE); August Baumgartner, Waldkirch (DE); Philip Kaupmann, Waldkirch (DE)

(73) Assignee: SICK AG, Waldkirch (DE)

( * ) Notice: Subject to any disclaimer, the term of this patent is extended or adjusted under 35 U.S.C. 154(b) by 583 days.

(21) Appl. No.: 18/227,492

(22) Filed: Jul. 28, 2023

(65) Prior Publication Data

US 2024/0061081 A1 Feb. 22, 2024

(30) Foreign Application Priority Data

Jul. 28, 2022 (DE) ......................... 102022118959.7

(51) Int. Cl.

| | |
|---|---|
| ***G01S 7/48*** | (2006.01) |
| ***G01S 7/481*** | (2006.01) |
| ***G01S 17/42*** | (2006.01) |
| ***G01S 17/88*** | (2006.01) |
| ***H05K 7/20*** | (2006.01) |

(52) U.S. Cl.

CPC .......... *G01S 7/4813* (2013.01); *G01S 7/4817* (2013.01); *G01S 17/42* (2013.01); *G01S 17/88* (2013.01); *H05K 7/2039* (2013.01)

(58) Field of Classification Search

USPC ................................................ 356/4.01, 5.01

See application file for complete search history.

(56) References Cited

U.S. PATENT DOCUMENTS

| | | | | |
|---|---|---|---|---|
| 9,091,535 | B2 * | 7/2015 | Baeg | G01S 17/89 |
| 10,903,729 | B1 * | 1/2021 | Cunnyngham | H02K 1/20 |
| 11,081,934 | B2 * | 8/2021 | Paritee | H02K 1/20 |

(Continued)

FOREIGN PATENT DOCUMENTS

| | | | |
|---|---|---|---|
| DE | 102017216241 | A1 | 3/2019 |
| DE | 102018214598 | A1 | 3/2020 |

(Continued)

OTHER PUBLICATIONS

Office Action issued Apr. 12, 2023, in corresponding German application DE 102022118959.7.

*Primary Examiner* — James R Hulka

(74) *Attorney, Agent, or Firm* — Nath, Goldberg & Meyer; Jerald L. Meyer

(57) ABSTRACT

To achieve improved heat transfer of an optoelectronic sensor to its environment, the optoelectronic sensor comprises a rotating optical unit with at least one light transmitter for emitting light beams, at least one light receiver for receiving light remitted by objects in the monitored area, and associated electronics for controlling the optical unit, a drive unit for rotating the optical unit, a housing for enclosing at least the optical unit, the housing having at least one window region which transmits transmitted light beams and received light, and heat exchange elements provided on the outside of the optical unit and arranged in such a way that the heat exchange elements rotate with the optical unit and flat sides of the heat exchange elements lie at a defined distance from an inner side of the housing in order to provide convective heat exchange with the housing.

9 Claims, 3 Drawing Sheets

(56) References Cited

U.S. PATENT DOCUMENTS

| | | | | |
|---|---|---|---|---|
| 11,088,578 | B2 * | 8/2021 | Cunnyngham ....... | H01F 41/063 |
| 11,520,013 | B2 * | 12/2022 | Hattass ................... | G01S 17/42 |
| 11,630,187 | B2 * | 4/2023 | Oliveira .............. | F28D 15/0208 165/287 |
| 12,487,332 | B2 * | 12/2025 | Karayacoubian ..... | G01S 7/4813 |
| 2014/0111812 | A1 | 4/2014 | Baeg et al. | |
| 2020/0271759 | A1 * | 8/2020 | Hattass ................... | G01S 17/42 |
| 2020/0309913 | A1 * | 10/2020 | Oliveira .............. | F28D 15/0208 |
| 2021/0135514 | A1 * | 5/2021 | Cunnyngham .......... | H02K 1/02 |
| 2021/0135544 | A1 * | 5/2021 | Paritee .................. | H01F 41/063 |
| 2022/0221560 | A1 | 7/2022 | Karayacoubian et al. | |

FOREIGN PATENT DOCUMENTS

| | | | |
|---|---|---|---|
| EP | 3032278 | B1 | 3/2017 |
| EP | 3715765 | A1 | 9/2020 |
| NO | 2021/086621 | A1 | 5/2021 |

* cited by examiner

OPTOELECTRONIC SENSOR FOR DETECTING OBJECTS IN A MONITORED AREA

The invention relates to an optoelectronic sensor for detecting objects in a monitored area comprising a rotating optical unit with at least one light transmitter for emitting light beams, at least one light receiver for receiving light remitted by objects in the monitored area, and associated electronics for controlling the optical unit, a drive unit for rotating the optical unit, a static housing for enclosing at least the optical unit, the housing having at least one window region which transmits transmitted light beams and received light.

Laserscanners are particularly well suited for distance measurements that require a large horizontal angular range of a monitored area. In this case, a light beam generated by a laser light transmitter periodically sweeps through the monitored area as a transmitted light beam. The transmitted light beam is remitted by objects in the monitored area and received by a light receiver. The received light, referred to below as received light or receiving light, is evaluated in the laserscanner by means of electronics.

The light transmitter, the light receiver and the associated electronics are combined in a rotating optical unit. From the angular position of a rotating shaft of the sensor, to which the optical unit is attached, the angular position of the object is inferred and from the time-of-flight of the light using the speed of light additionally the distance of the object from the sensor is inferred.

With the angle and distance information, an object is detected in the monitored area.

Due to the increasing performance of the electronics and the more compact design of the sensor, there is a high heat generation in the sensor, which cannot be solved satisfactorily by passive cooling, such as cooling pads, so that it is difficult to maintain a permissible operating temperature of the sensor. A higher temperature of the device also has a negative effect on a lifetime and a performance of the sensor.

In known laserscanners, where the electronics are located in non-rotating housing parts, the heat can be dissipated directly to the housing of the laser scanner, so that a heat exchange between laserscanner and environment is possible.

If the electronics are provided in the rotating optical unit (rotor), direct dissipation of the heat from the electronics to the housing is not possible without considerable design effort. The use of mechanical components made of metal to improve heat conduction has a negative effect on the rotor, because of the weight because this requires a larger motor with a higher payload, which results in lower robustness against environmental stress (shock/vibration). Further, this leads to more power consumption of the device and in turn higher energy consumption and heat input. Heat dissipation through the bearing, bearing shaft and motor is severely limited due to the low heat dissipation of these components. Heat could also be dissipated through the air surrounding the rotor, but the constant rotation causes a stable circumferential flow to form, so the relative velocity of the air near the heat sources is very low as a result. The air does heat up, but there is hardly any turbulence and thus heat transport is reduced. Also, mechanical elements, especially optics, create areas that are shadowed with respect to the air flow. Pockets are formed from which almost no convective heat transport takes place. Overall, the heat exchange between the rotating electronics and the static housing, and thus the environment, is insufficient.

It is therefore an object of the present invention to provide an optoelectronic sensor that enables improved heat exchange between the heat-generating components of the sensor's electronics and the environment.

This task is solved according to the invention by an optoelectronic sensor for detecting objects in a monitored area which includes:

a rotating optical unit with at least one light transmitter for emitting light beams, at least one light receiver for receiving received light that is remitted from objects in the monitored area, and associated electronics for controlling the optical unit, a drive unit for rotating the optics unit, a static housing for enclosing at least the optical unit, the housing having at least one window region which transmits transmitted light beams and received light, and heat exchange elements provided on the outside of the optical unit and arranged in such a way that the heat exchange elements rotate with the optical unit and flat sides of the heat exchange elements are located at a defined distance from an inside of the housing to provide convective heat exchange with the housing.

Due to the heat exchange elements being guided along the inside of the static housing during rotation, air is swirled in the small gap between the flat sides of the heat exchange elements and the inside of the housing, resulting in improved heat transfer. This ensures optimum convective heat transfer. The associated mixing of the air layers allows significantly higher heat transfer between the heat exchange elements and the housing and thus ultimately the environment of the sensor.

Preferably, the defined distance is as small as possible and is in the single-digit millimeter range, in particular from two to nine millimeters. This advantageously leads to increased convection of heat between the heat exchange elements and the housing.

According to a preferred embodiment, the heat exchange elements are designed in such a way that the flat sides run essentially parallel to the inside of the housing in order to achieve turbulence and thus good convection over a larger area, i.e. over the entire flat side of a heat exchange element. Here, the housing can be cylindrical, conical or dome-shaped. The flat sides move parallel to the inside of the static housing at the defined small distance.

Furthermore, the heat exchange elements preferably have a large surface area to form wall sections around the circumference of the optical unit. In particular, a heat exchange element can cover a quarter of the circumference of the optical unit. This provides a larger surface area for heat transfer. Furthermore, the heat exchange elements as components of the rotor can contribute to an improvement of the structural stability of the optical unit.

According to a preferred embodiment, at least two heat exchange elements are arranged diametrically on the circumference of the optical unit. On the one hand, this allows simple balancing and, on the other hand, it leaves room for light emitters and light receivers of the optical unit arranged in between with a free field of view and yet compact design.

The heat exchange elements consist in particular of a material with high thermal conductivity, preferably aluminum or copper. In conjunction with the large-area design of the heat exchange elements, high and rapid heat absorption from the inside of the optical unit and rapid heat dissipation to the housing of the sensor can thus be achieved.

Advantageously, the heat exchange elements are connected to the heat sources of the electronics of the optical unit in a thermally conductive manner, for example by means of thermally conductive materials such as heat conducting plates. The heat generated inside the optical unit is thus conducted more quickly to the heat exchange elements, so that heat dissipation from the optical unit can be further improved.

Since heat conduction transferring components in the motor with bearing shaft and bearing are no longer necessary, these components can now be designed from plastic and thus with lower weight. This reduces the weight of the rotor and drive energy can be saved.

According to a preferred embodiment, the optoelectronic sensor is designed as a scanner, in particular a laserscanner, which can detect the position of the object via distance and angle to the object. In particular, the optical unit is designed to sweep over an angle of 360° with the transmitted light beam.

Preferred embodiments and further embodiments as well as further advantages of the invention can be found in the subordinate claims, the following description and the drawings.

In the following, the invention is described in detail by means of embodiments with reference to the drawing. In the drawing FIG. 1 shows a schematic perspective view of a preferred embodiment of a sensor according to the invention;

Figure 1:
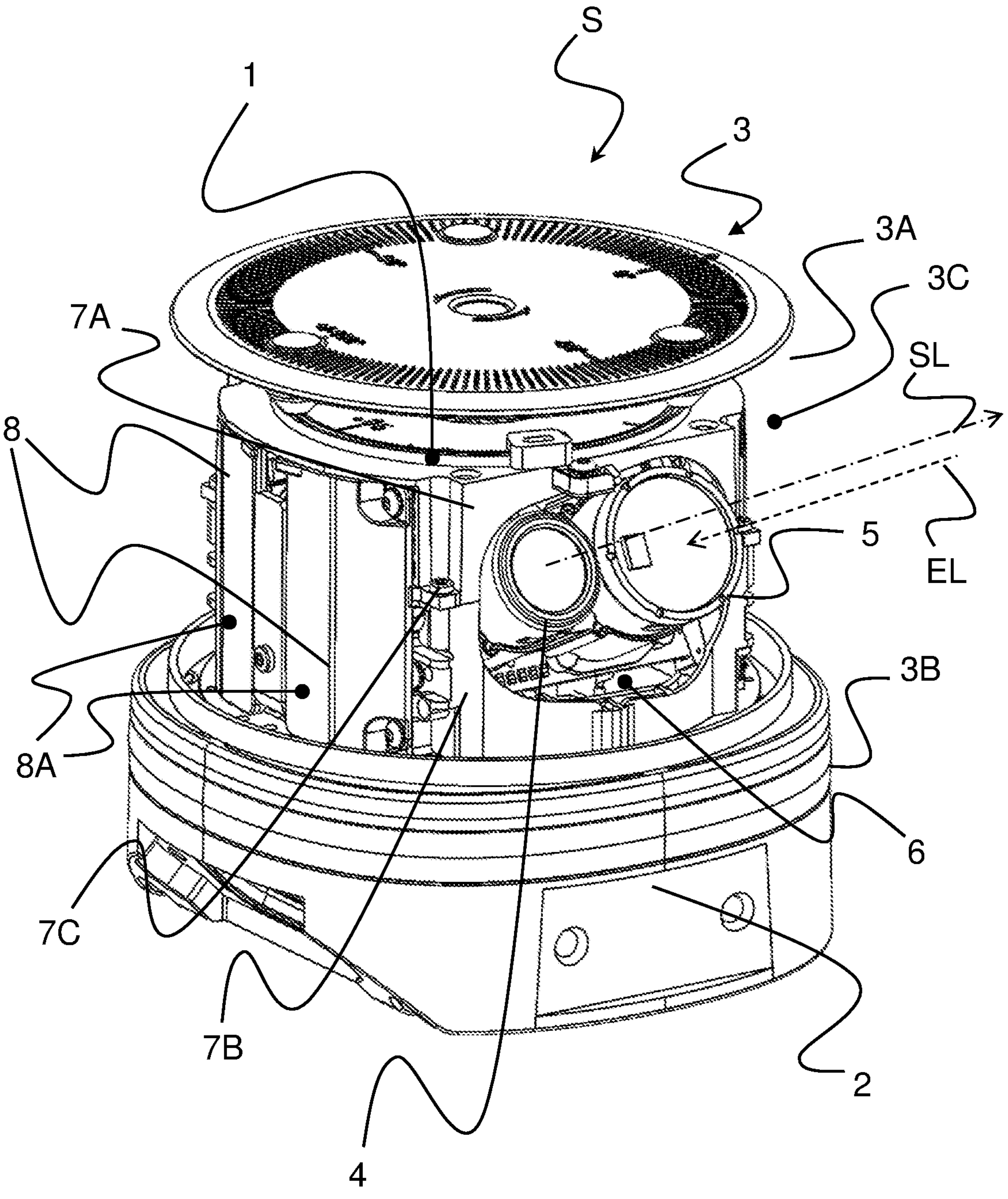
FIG. 1 shows a schematic perspective view of a preferred embodiment of a sensor S according to the inventive subject matter, which is designed to detect objects in a monitored area.

The sensor S shown comprises a rotating optical unit 1, a drive unit 2 and a static housing 3, wherein in the embodiment shown in FIG. 1 the housing 3 consists of a first housing part 3A and a second housing part 3B. The first housing part 3A houses the rotating optical unit 1 and has at least one light-transmitting window area 3C, which extends over 360° and is thus rotationally symmetrical. The second housing part 3B houses the drive unit 2, which is connected to the optical unit 1 and rotates it about a longitudinal axis of the sensor S that is not shown.

The optical unit 1 comprises at least one light transmitter 4, which is preferably formed by a laser. The light transmitter 4 generates a transmitted light beam SL, which is preferably emitted in the form of light pulses into the monitored area. If the transmitted light beam SL strikes an object in the monitored area, a corresponding light beam is remitted to the sensor S as received light EL. The transmitted light beam SL and the received light EL pass through the window area 3C of the first housing part 3A.

Furthermore, the optical unit 1 comprises at least one light receiver 5, preferably consisting of a detector array, which receives the received light EL. The received light beam EL is converted into an electrical receiving signal.

Furthermore, electronics 6, in particular at least one printed circuit board not shown with corresponding electronic and optoelectronic components, are provided in the optical unit 1, the electronics 6 serving to control the optical unit 1. The light emitter 4, the light receiver 5 and the electronics 6 form heat sources of the optical unit 1, wherein the heat of the heat sources is to be conducted from the interior of the optical unit 1 to the housing 3 and there emitted to the environment.

First and second structural parts 7A and 7B are provided, to which the light emitter 4, the light receiver 5 and the electronics 6 are mounted. As shown in FIG. 1, the first and second structural parts 7A and 7B are screwed together by screws 7C. The structural parts 7A and 7B of the optical unit 1 are preferably made of a material having a low inherent weight, preferably plastic or composite material, so that the optical unit 1 can be formed to be light overall.

Figure 2:
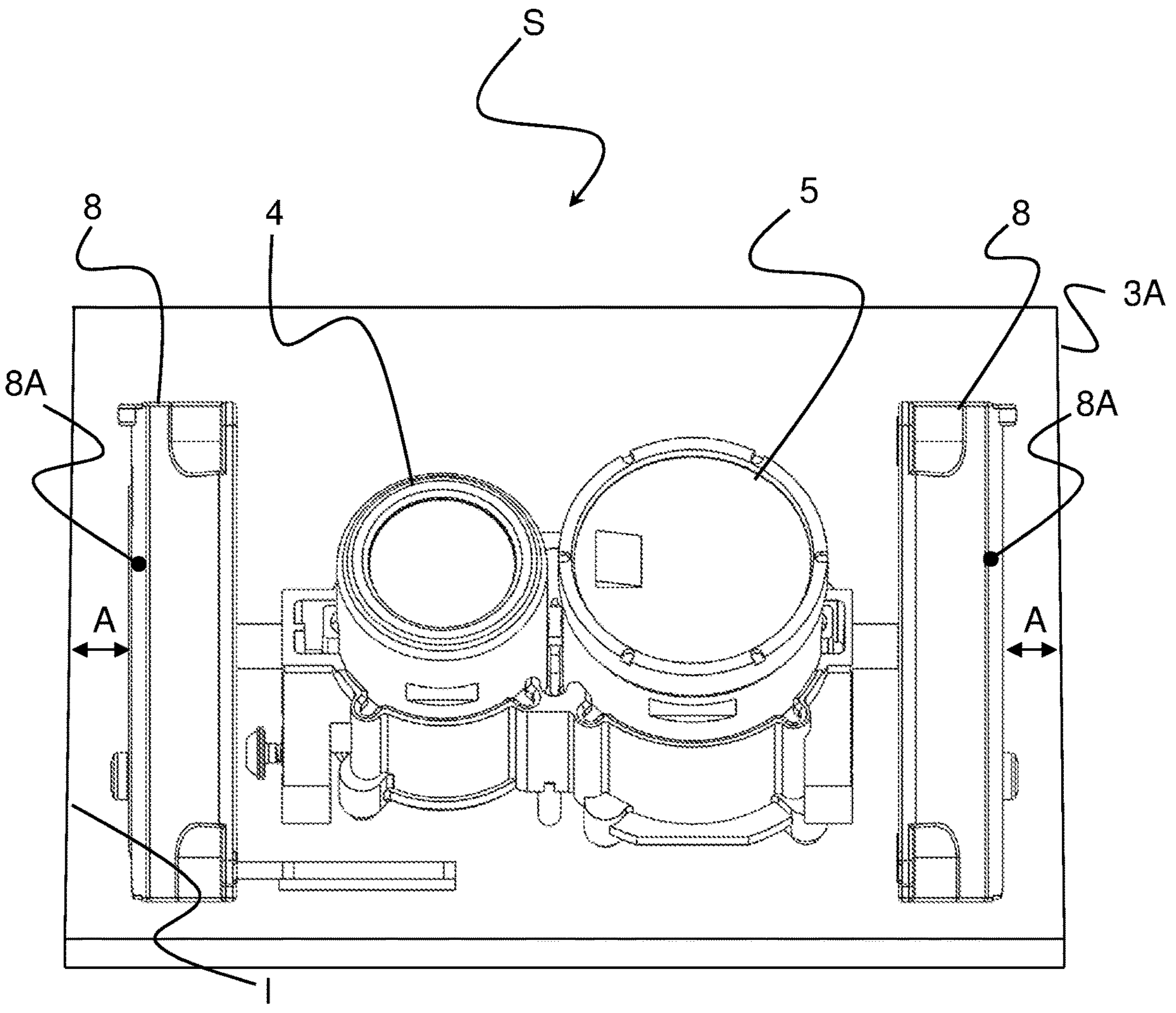
FIG. 2 shows a schematic view of an optical unit of the sensor according to the invention.

According to the invention, heat exchange elements 8 are provided on the outside of the optical unit 1 and are arranged on the circumference in such a way that the heat exchange elements 8 rotate with the optical unit 1 and flat sides 8A of the heat exchange elements 8 are located at a defined distance A from an inside I of the housing 3, as shown in FIG. 2, in order to effect convective heat exchange with the housing 3.

The heat exchange elements 8 are preferably formed as square cover parts, which are formed over a large area with curved flat sides 8A. The curvature of the curved flat side 8A corresponds approximately to the curvature of the first housing part 3A so that the flat sides 8A are approximately parallel to the wall of the housing part 3A, i.e. the distance A between the flat sides 8A and the wall is about constant over the extension of flat side 8A. Attached to the first and second structural members 7A and 7B, the heat exchange members 8A form quasi wall portions of the optical unit 1 at the periphery of the optical unit 1. Hereby, the heat exchange members 8 can contribute to the mechanical stability of the optical unit.

FIG. 2 shows a schematic view of the optical unit 1 of the preferred embodiment of the sensor S, showing the light emitter 4, the light receiver 5 and the heat exchange elements 8. The first housing part 3A encloses said parts.

The at least two heat exchange elements 8 are arranged diametrically on the circumference of the optical unit 1. Between them, optical elements of the light transmitter 4 and the light receiver 5 are arranged in such a way that the optical elements protrude between the two heat exchange elements 8. This allows the transmitted light beam SL and the received light EL to be transmitted and received unhindered by the heat exchange elements 8.

The defined distance A is provided between the flat sides 8A of the heat exchange elements 8 and the inside I of the first housing part 3A. Advantageously, the defined distance A is in a single-digit range of millimeters, in particular from two to nine millimeters.

During operation of the sensor S, i.e. when the optical unit 1 rotates, the hot air generated inside the optical unit 1 flows around the heat exchange elements 8. A flow is formed in the gap between the flat sides 8A of the heat exchange elements 8 and the inside I of the first housing part 3A, which leads to a significantly higher convective heat exchange between the heat exchange elements 8 and the housing 3 and thus the environment.

Advantageously, the flat sides 8A of the heat exchange elements 8 are arranged approximately parallel to the inner side I of the housing 3 or the first housing part 3A, so that the defined distance A is approximately the same over the entire surface of the flat sides 8A. Here, the first housing part 3A can have a cylindrical, conical or dome-shaped form.

The heat exchange elements 8 are made of a material with high thermal conductivity, preferably aluminum or copper. The material also enables a reduction of the dead weight of the heat exchange elements 8.

Figure 3:
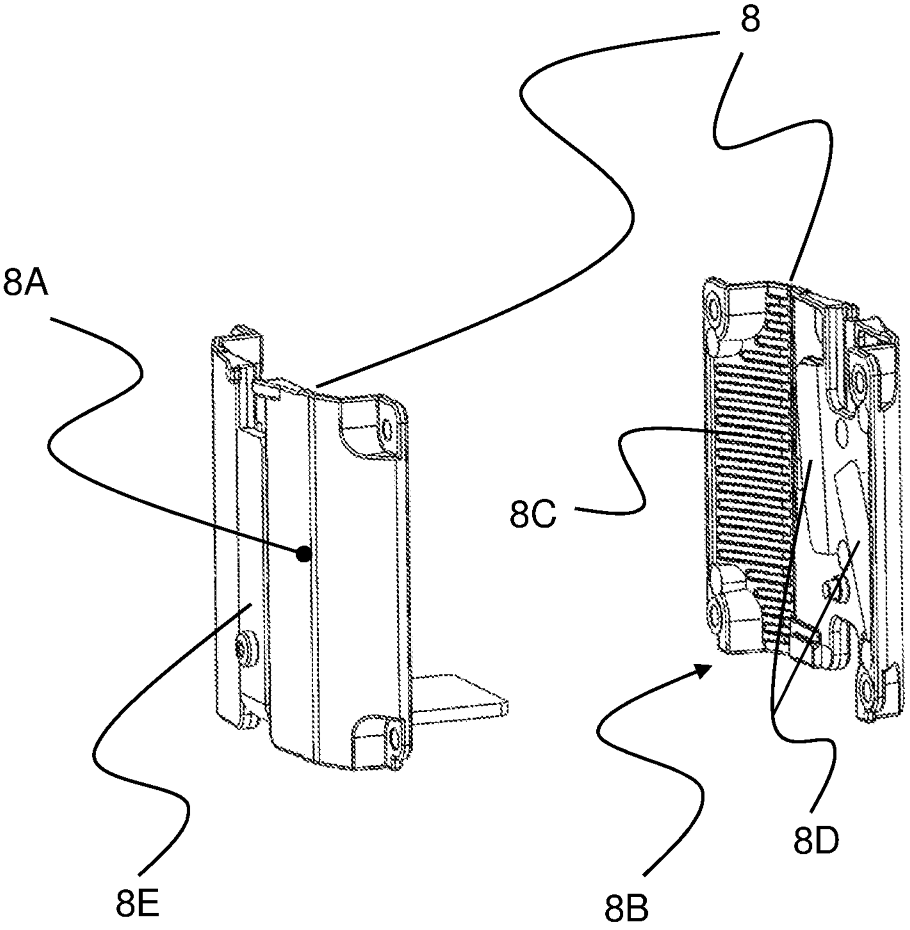
FIG. 3 shows a detailed view of a preferred embodiment of the heat exchange elements of the sensor according to the invention.

FIG. 3 shows a schematic perspective view of the heat exchange elements 8, wherein in particular an inner side 8B of a heat exchanger element 8 is shown in detail. The inner side 8B of the heat exchange element 8 has ribs 8C for weight reduction. In addition, thermally conductive pads 8D may be provided, which are attached to the inner side 8B of the heat exchange elements 8.

In the preferred embodiment shown, a heat sink 8E is preferably arranged between two halves of a heat exchange element 8. The body 8E or the heat exchange elements 8 are directly connected to heat sources, in particular the electronics 6 of the optical unit 1, which are not shown, via heat-conducting lines.

Remotely, heat baffles provided inside the optical unit 1 and not shown may be arranged to direct the warm air toward the heat exchange elements 8 so that the heat is conducted more quickly and directly to the heat exchange elements 8.

Due to the aforementioned designs of the heat exchange elements 8 inside the optical unit 1, a dissipation of heat from the inside of the optical unit 1 is greatly improved.

The described preferred embodiments of the sensor S according to the inventive subject matter comprise a scanner, in particular a laser scanner, which is designed to detect a distance between the object not shown and the scanner and an angle of the object to a zero angle of the scanner. In the scanner, the optical unit 1 is designed to sweep over an angle of 360° with the transmitted light beam SL.

LIST OF REFERENCE SIGNS

1 optical unit
2 drive unit
3 housing
3A first housing part
3B second housing part
4 light transmitter
5 light receiver
6 electronics
7A first structure part
7B second structural part
7C screws
8 heat exchange element
8A flat side of the heat exchange element
8B inside of the heat exchange element
8C ribs
8D heat pads
8E heat sink
A defined distance
EL receiving light
I inside of the housing
S optoelectronic sensor
SL trasmitted light beam

The invention claimed is:

1. An optoelectronic sensor(S) for detecting objects in a monitored area, comprising:

a rotating optical unit (1) with at least one light transmitter (4) for emitting light beams (SL), at least one light receiver (5) for receiving light (EL) reflected by objects in the monitored area, and associated electronics (6) for controlling the optical unit (1);

a drive unit (2) for rotating the rotating optical unit (1);

a stationary housing (3) for enclosing at least the rotating optical unit (1), the stationary housing (3) having at least one window region (3C) which is transmissive to the emitted light beams (SL) and the received light (EL); and heat exchange elements (8) which are provided on an outside of the optical unit (1) and are arranged such that the heat exchange elements (8) rotate together with the rotating optical unit (1), wherein flat sides (8A) of the heat exchange elements (8) lie at a defined distance (A) from an inner side (I) of the stationary housing (3), and wherein at least two of the heat exchange elements (8) are arranged diametrically on a circumference of the rotating optical unit (1) such that optical elements of the at least one light emitter (4) and the at least one light receiver (5) are arranged between the at least two of the heat exchange elements (8).

2. The optoelectronic sensor(S) according to claim 1, wherein the heat exchange elements (8) are formed such that the flat sides (8A) are parallel to the inner side (I) of the stationary housing (3).

3. The optoelectronic Optoelectronic sensor(S) according to claim 1, wherein the defined distance (A) is in a single-digit millimeter range preferably.

4. The optoelectronic sensor(S) according to claim 1, wherein the heat exchange elements (8) are made of a material with high thermal conductivity.

5. The optoelectronic sensor(S) according to claim 1, wherein the heat exchange elements (8) are connected to heat sources of the rotating optical unit (1) via heat-conducting lines.

6. The optoelectronic sensor(S) according to claim 1, wherein supporting structural parts (7A, 7B) of the rotating optical unit (1) are made of plastics or composites.

7. The optoelectronic sensor(S) according to claim 1, wherein heat conducting sheets provided inside the rotating optical unit (1) are arranged such that they conduct hot air towards the heat exchange elements (8).

8. The optoelectronic sensor(S) according to claim 1, wherein the sensor (1) is a scanner which is designed to detect a position of an object.

9. The optoelectronic sensor(S) according to claim 1, wherein the rotating optical unit (1) is configured to scan over an angle of 360° using the transmitted light beam (SL).

* * * * *